United States Patent
Franz et al.

(10) Patent No.: US 6,513,770 B1
(45) Date of Patent: Feb. 4, 2003

(54) ELECTRONIC DEVICE SUPPORT AND METHOD

(75) Inventors: Perry D. Franz, Elk Mound, WI (US); Jeffrey Mark Glanzman, Mondovi, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/548,821

(22) Filed: Apr. 13, 2000

Related U.S. Application Data (63) Continuation-in-part of application No. 09/408,148, filed on Sep. 29, 1999, now Pat. No. 6,452,805.

(51) Int. Cl.[7] .............................................. F16M 11/00
(52) U.S. Cl. .................... 248/200; 312/223.1; 361/724
(58) Field of Search ............................ 248/200, 200.1, 248/201; 211/191, 192, 135, 187, 26, 189; 312/223.1–223.3, 265.3–265.6; 361/683, 656, 724–727, 79 A (56) References Cited

U.S. PATENT DOCUMENTS

| | | | |
|---|---|---|---|
| 2,531,110 A | 11/1950 | Cisler | 174/52 |
| 3,657,608 A | 4/1972 | Leone et al. | 317/118 |
| 3,677,615 A | * 7/1972 | Hudson | |
| 4,442,476 A | 4/1984 | Lenderking et al. | 361/395 |
| 4,535,703 A | 8/1985 | Henriott et al. | 108/50 |
| 4,892,489 A | 1/1990 | Hirai | 439/497 |
| 5,027,257 A | 6/1991 | Lockwood et al. | 361/428 |
| 5,049,701 A | 9/1991 | Vowles et al. | 174/35 R |
| 5,142,442 A | 8/1992 | Daniels et al. | 361/384 |
| 5,154,126 A | 10/1992 | Newhouse et al. | 108/50 |
| 5,165,770 A | 11/1992 | Hahn | 312/265.4 |
| 5,209,356 A | 5/1993 | Chaffee | 211/26 |
| 5,238,418 A | 8/1993 | Koiner | 439/157 |
| 5,275,494 A | 1/1994 | Petracca et al. | 400/83 |
| 5,277,131 A | 1/1994 | Fortsch | 108/50 |
| 5,291,368 A | 3/1994 | Conroy-Wass | 361/796 |
| 5,331,508 A | 7/1994 | Hosoi et al. | 361/680 |
| 5,339,221 A | 8/1994 | Conroy-Wass et al. | 361/796 |
| 5,355,278 A | 10/1994 | Hosoi et al. | 361/680 |
| 5,385,870 A | 1/1995 | Maue et al. | 439/157 |
| 5,559,922 A | 9/1996 | Arnett | 385/135 |
| 5,568,362 A | 10/1996 | Hansson | 361/736 |
| 5,571,256 A | * 11/1996 | Good et al. | |
| 5,574,251 A | 11/1996 | Sevier | 174/50 |
| 5,586,003 A | 12/1996 | Schmitt et al. | 361/683 |
| 5,586,012 A | 12/1996 | Lerman | 361/826 |

(List continued on next page.)

*Primary Examiner*—Korie Chan
(74) *Attorney, Agent, or Firm*—Schwegman, Lundberg, Woessner & Kluth, P.A.

(57) ABSTRACT

An improved support bracket for supporting electronic devices provides improved adjustability and alignment. The support bracket includes a front surface and a rear surface each including a portion having at least one threaded hole and a support portion between the front surface and rear surface for supporting an electronic device. The support bracket includes a side portion having a mechanism for coupling the side portion to a structure, a guide portion and a support portion for supporting an electronic device.

25 Claims, 9 Drawing Sheets

U.S. PATENT DOCUMENTS

| | | | |
|---|---|---|---|
| 5,611,708 A | 3/1997 | Mizunuma et al. | 439/358 |
| 5,618,091 A * | 4/1997 | Huber et al. | |
| 5,654,873 A | 8/1997 | Smithson et al. | 361/685 |
| 5,666,271 A | 9/1997 | Kim et al. | 361/726 |
| 5,673,632 A | 10/1997 | Sykes | 108/121 |
| 5,690,403 A | 11/1997 | Ellison et al. | 312/223.6 |
| 5,724,469 A | 3/1998 | Orlando | 385/135 |
| 5,761,033 A | 6/1998 | Wilhelm | 361/686 |
| 5,788,087 A | 8/1998 | Orlando | 211/26 |
| 5,803,770 A | 9/1998 | Swendson et al. | 439/676 |
| 5,823,650 A * | 10/1998 | Lin | |
| 5,896,273 A | 4/1999 | Varghese et al. | 361/724 |
| 5,975,735 A | 11/1999 | Schmitt | 364/131 |
| 6,009,224 A | 12/1999 | Allen | 385/135 |
| 6,016,252 A | 1/2000 | Pignolet et al. | 361/724 |
| 6,021,909 A * | 2/2000 | Tang et al. | |
| 6,081,644 A | 6/2000 | Stateczny et al. | 385/135 |
| 6,088,222 A | 7/2000 | Schmitt et al. | 361/686 |
| 6,095,345 A | 8/2000 | Gibbons | 211/26 |
| 6,123,203 A * | 9/2000 | Gibbons | |
| 6,129,429 A | 10/2000 | Hardt et al. | 312/223.2 |
| 6,259,605 B1 | 7/2001 | Schmitt | 361/727 |
| 6,279,754 B1 | 8/2001 | Hoss et al. | 211/26 |

\* cited by examiner

ELECTRONIC DEVICE SUPPORT AND METHOD

This application is a Continuation-in-part application of U.S. application Ser. No. 09/408,148 filed Sep. 29, 1999, now U.S. Pat. No. 6,452,805, the specification of which is herein incorporated by reference.

FIELD OF INVENTION

This invention relates to hardware for electronic devices, and in particular to a support for supporting electronic devices.

BACKGROUND

Commercial use electronic systems typically include electronic devices resting on a special sub-floor allowing for cable routing and grounding beneath the floor surface. In some cases, electronic devices are supported in commercial structures or racks.

Installation, service and upgrade of a commercial computer system can be a protracted and cumbersome process. Installation may require time consuming placement of supports within the standard racks.

Service and upgrade of commercial systems also typically requires removal of an electronic device from the rack. The difficulty of removing a module from the rack can be compounded by the increased weight of the element. Service and upgrade also may require disassembly of the computer module housing to access, repair or replace components internal to the module before the module is replaced within a rack.

When an electronic system is scaled or reconfigured and an electronic device is instead exchanged for another device of a different size, the supports within the rack have to be removed and reinstalled to accommodate the new device in the system. Supports are typically attached to the rack using a multi-piece fastener such as a nut and screw that must be assembled through a standard industry size aperture.

Electronic systems formed from these discrete units must be assembled together to make a larger system. Modules are typically difficult to align and install into the rack. The position of the module must typically be adjusted into the proper position and must be adjusted in order to be secured within the rack. Accessing portions of the electronic system typically requires accessing a number of discrete modules. Modules will typically be positioned within racks providing poor access to the module. This can slow the installation, service, and upgrade processes making larger systems from these components less desirable. This is also one cause of poor field serviceability. Proper positioning and servicing of modules is often either not done, poorly done, or is improperly done.

A need exists for improved electronic devices and for an improved means for supporting the electronic devices and for improving the ease with which commercial systems are installed, serviced, upgraded and scaled.

DISCLOSURE OF INVENTION

According to one aspect of the invention, the support bracket includes a front surface and a rear surface each including a portion having at least one threaded hole and a support portion between the front surface and rear surface for supporting an electronic device.

According to one aspect of the invention, the improved support bracket includes a side portion having a mechanism for coupling the side portion to a structure, a guide portion and a support portion for supporting an electronic device.

The resulting support bracket improves the ease with which the support bracket is installed, repositioned or removed from a structure and improves placement, installation, service and upgrade of electronic devices.

DESCRIPTION OF EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
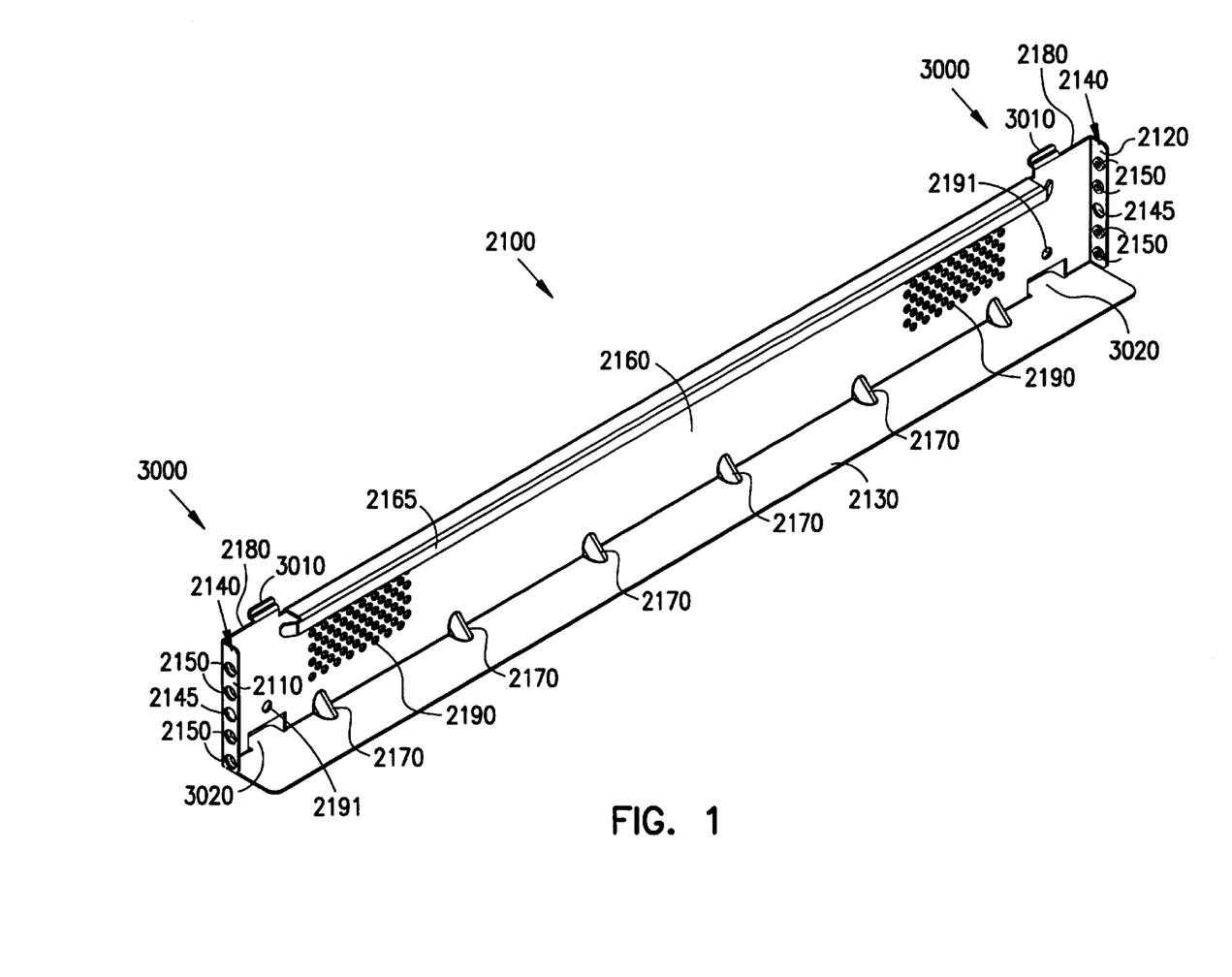
FIG. 1 is a view of one embodiment of a support bracket.

FIG. 1 illustrates an improved support bracket 2100 for use in mounting electronic devices in a structure. The improved support bracket 2100 provides improved adjustability in that the support bracket 2100 can be vertically adjusted along the length of the structure with greater ease than conventional supports. In one embodiment, the support bracket 2100 includes a front mounting portion 2110 and rear mounting portion 2120 including a series of holes 2140 and a support portion 2130 being coupled between the front 2110 and rear 2120 mounting portion. The support can be used to mount an electronic device in a structure 1000 such as that described in U.S. application Ser. No. 09/408148 Computer Module Mounting System and Method.

In one embodiment, the series of holes 2140 on the front and rear mounting portion 2110, 2120 include threaded holes 2150 for aligning with a first series of apertures 2020 on a structure 1000 or on vertical rail 2000 coupled to a structure 1000.

Figure 3:
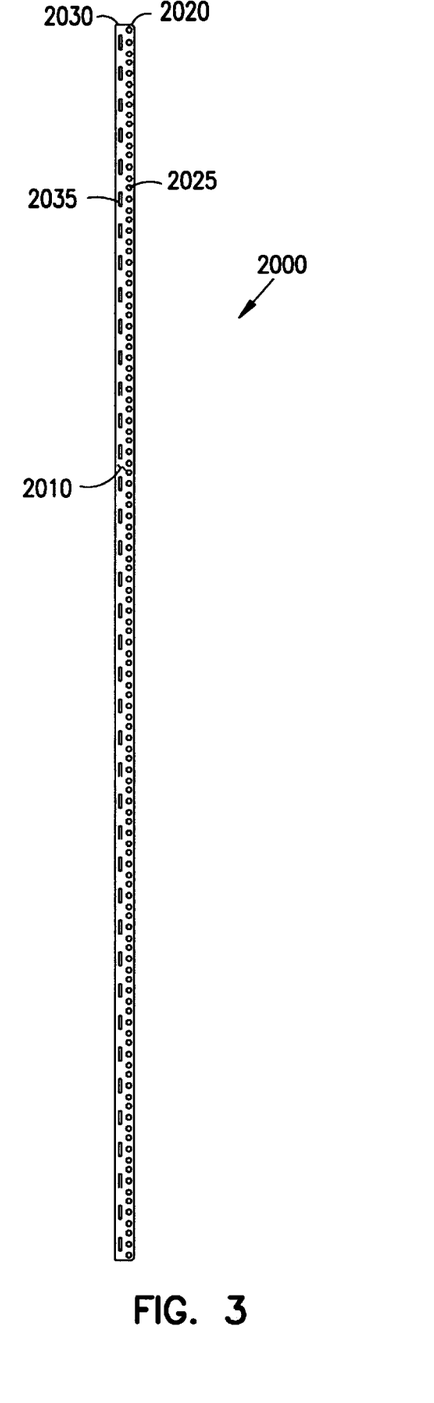
FIG. 3 is a front view of one embodiment of a rail.
Figure 4:
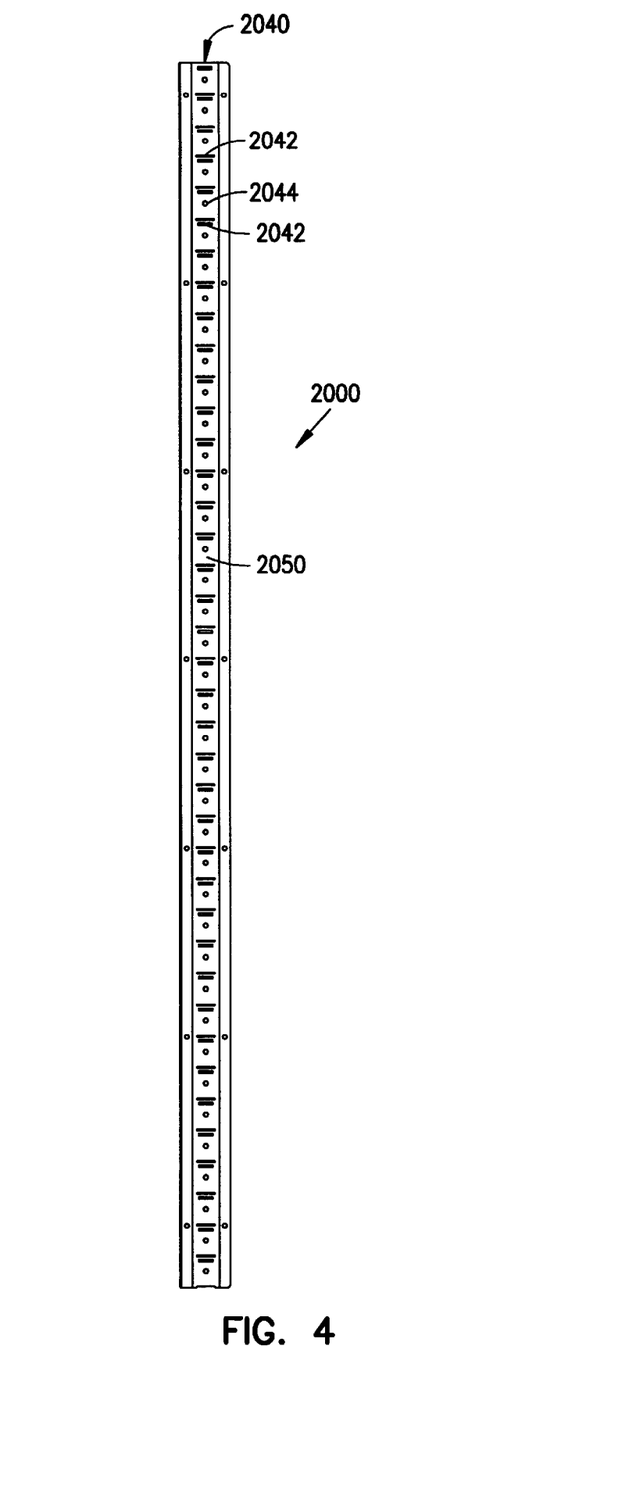
FIG. 4 is a side view of one embodiment of a rail.
Figure 5:
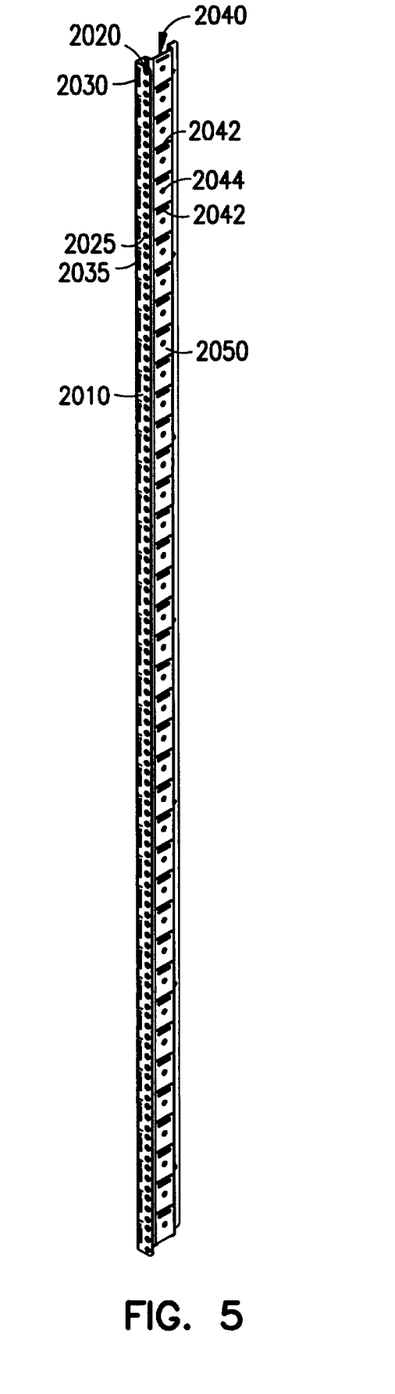
FIG. 5 is an isometric view of one embodiment of a rail.
Figure 6:
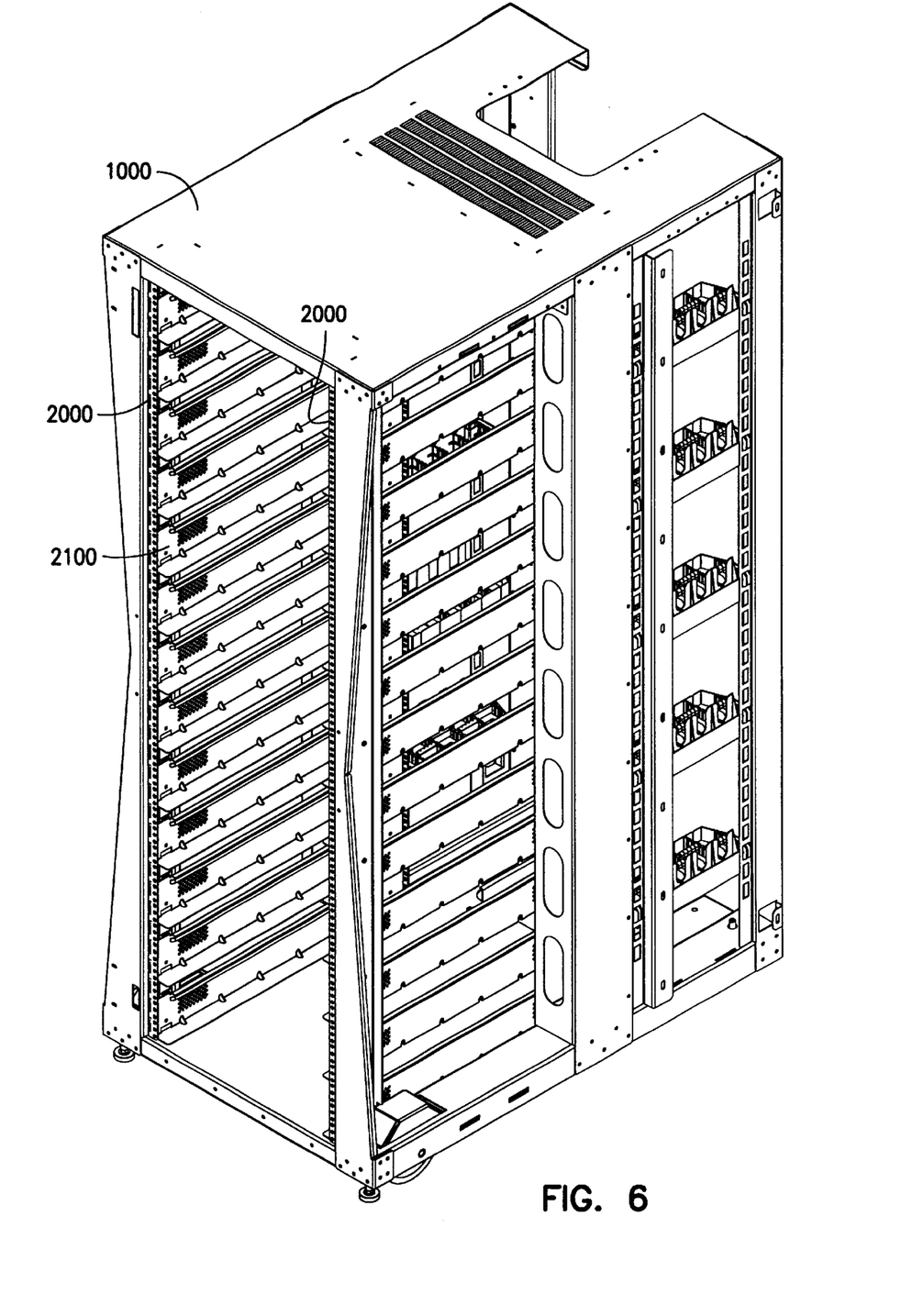
FIG. 6 is a view of a structure having a support bracket.
Figure 7:
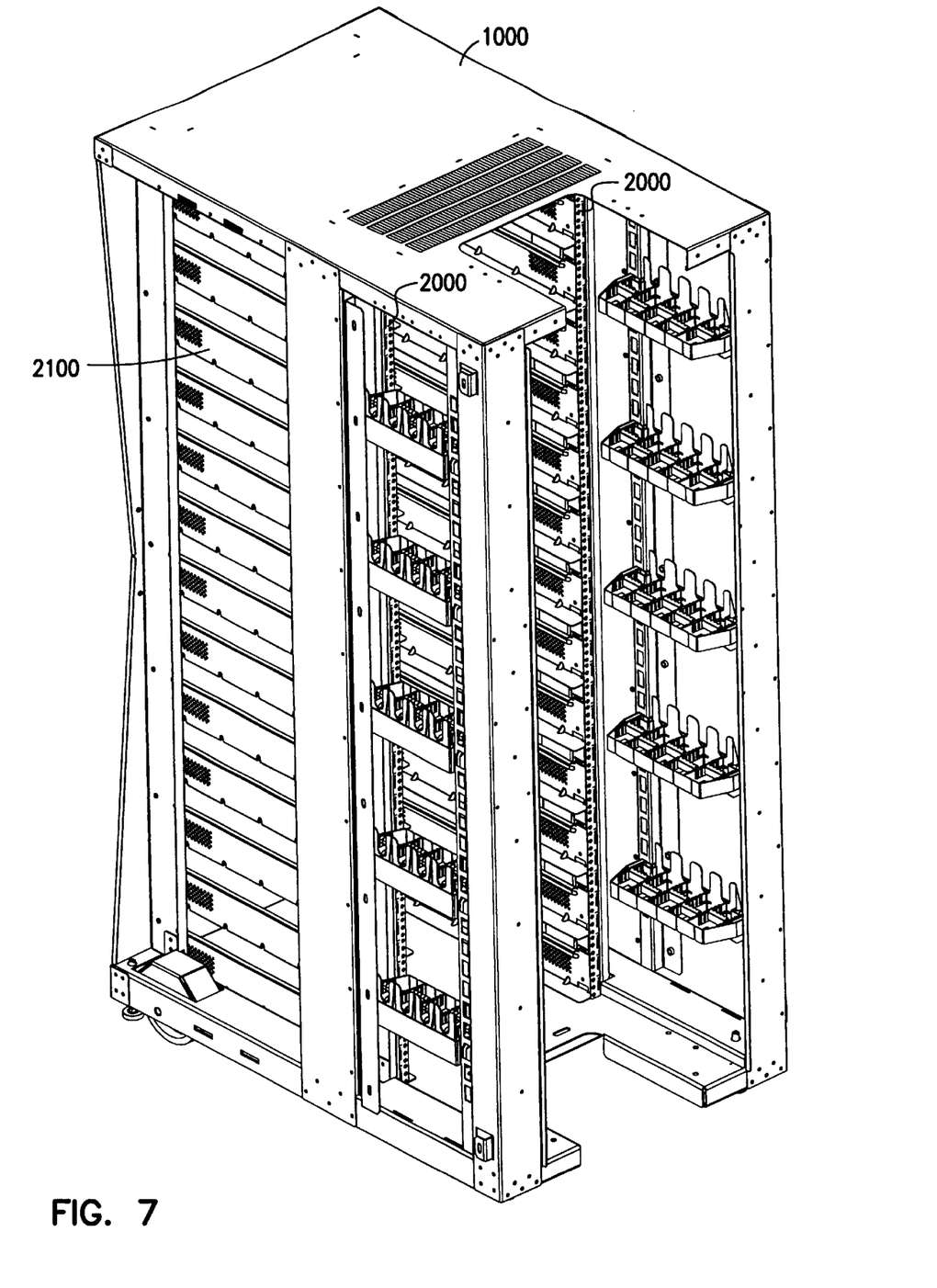
FIG. 7 is a view of a structure having a support bracket.

FIGS. 3, 4 and 5 illustrate embodiments of a vertical rail 2000 for coupling to a structure 1000. FIGS. 6 and 7 illustrate an embodiment of a plurality of support brackets 2100 coupled to vertical rails 2000 which are coupled to a structure 1000. A threaded fastener inserted through an unthreaded aperture 2020 on the rail 2000 can then engage a threaded hole 2150 on the front 2110 and rear 2120 mounting portion of the support bracket 2100 to secure the support bracket 2100. Where the apertures 2025 on the rail 2000 are of a standard industry size that is relatively small, this may dictate use of relatively small fasteners which can be awkward to handle because of their size. In one embodiment, the threaded hole 2150 aligns with a first series of apertures 2020 on the vertical rail 2000 of a standard industry size 2025. The support bracket improves the ease with which the bracket is installed, repositioned, or removed as the support bracket 2100 eliminates the need for a two piece fastener that must be handled on both sides of the aperture 2025 on the vertical rail 2000 and allows use of a one piece fastener from the outer face 2015 of the rail 2000 instead. In another embodiment, the front and rear mounting portion 2110, 2120 of the support bracket 2100 include threaded holes 2150. In another embodiment, the front and rear mounting portion 2110, 2120 include threaded holes 2150 having an increased number of threads extending from the surface of the front and rear mounting portions 2110, 2120 so that the threaded portion is actually wider than the thickness of the mounting portion 2110. This increases the thread engagement providing for improved fastener retention. In one embodiment, the threaded hole is extended when forming the threads.

Figure 2:
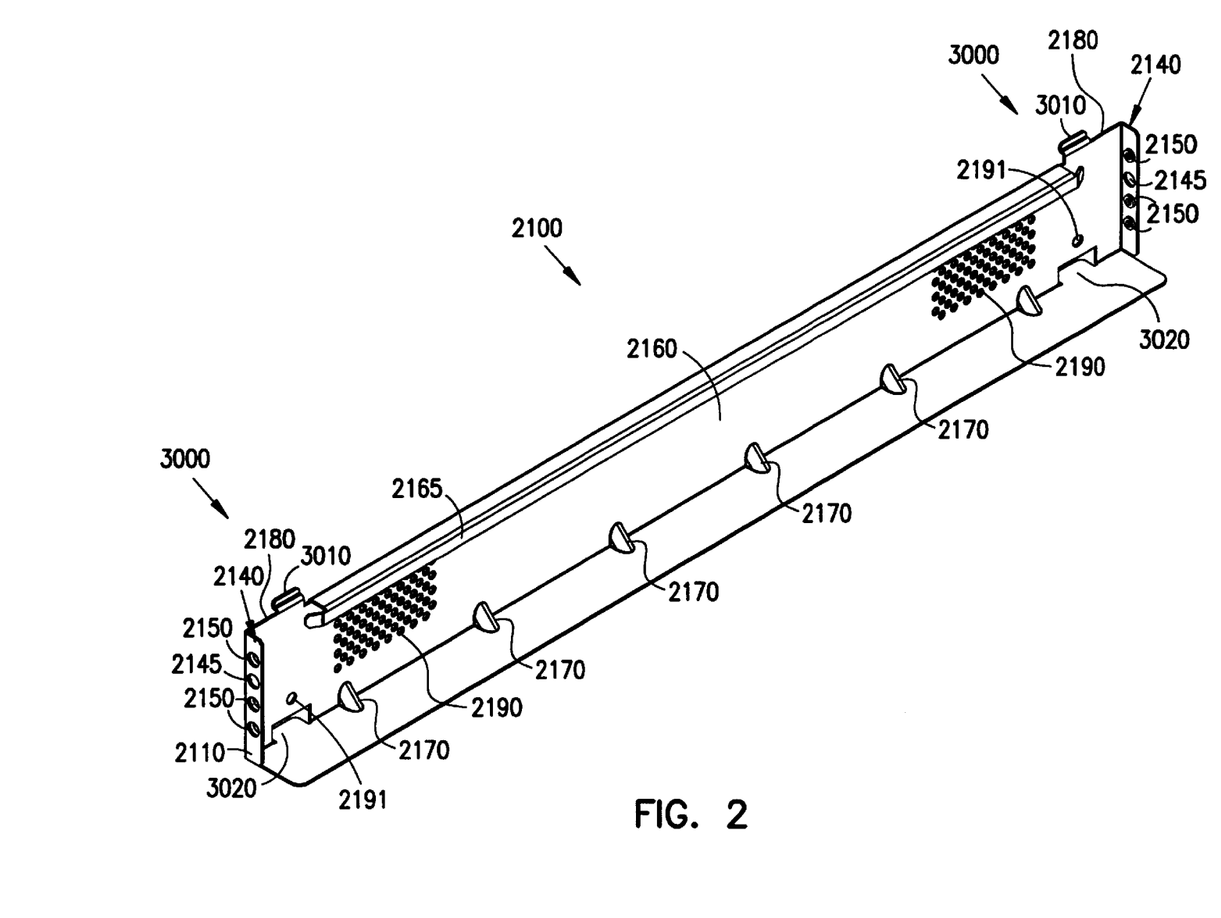
FIG. 2 is a view of one embodiment of a support bracket.

In another embodiment, the mounting portion 2110, 2120 of the support includes at least one unthreaded hole 2145. In one embodiment, the mounting portion 2110, 2120 include at least one threaded 2150 and at least one unthreaded hole 2145. This provides increased flexibility with regard to the type of fastener used to secure the support to the structure 1000. In one embodiment, an internal support mounting system includes a hole 2145 that is precisely machined and located to tight tolerances for aligning with precisely machined and located rail 2000 apertures such as apertures 2020 and 2025. The result is highly consistent placement of electronic devices such within the structure 1000 system. In one embodiment, this helps to improve alignment required by additional features such as an insertion/extraction mechanism for inserting and extracting a portion of an electronic device such as described in U.S. application Ser. No. 09/408,969 Printed Circuit Board Carrier Insertion/Extraction Assembly. In one embodiment, this enables precise and repeatable alignment with other features of the structure such as an external platform as described in U.S. application Ser. No. 09/408148 Computer Module Mounting System and Method for all adjustable positions of the electronic device within the structure and for all adjustable positions of the platform.

In another embodiment, the support bracket 2100 further includes a side portion 2160 coupled between the front mounting portion 2110 and rear mounting portion 2120 and coupled to the support portion 2130. In one embodiment, the side portion 2160 includes a guide portion 2165 extending from the side portion 2160 for positioning the computer component. The guide portion 2165 helps to guide the position of the electronic device during installation into the structure 1000 and helps to maintain its horizontal placement within the structure 1000. This helps to improve alignment required by additional features such as an insertion/extraction mechanism for inserting and extracting a portion of an electronic device such as described in U.S. application Ser. No. 09/408,969 Printed Circuit Board Carrier Insertion/Extraction embodiment, this enables precise and repeatable alignment with other features of the structure such as an external platform as described in U.S. application Ser. No. 09/408148 Computer Module Mounting System and Method for all adjustable positions of the electronic device within the structure and for all adjustable positions of the platform.

Figure 8:
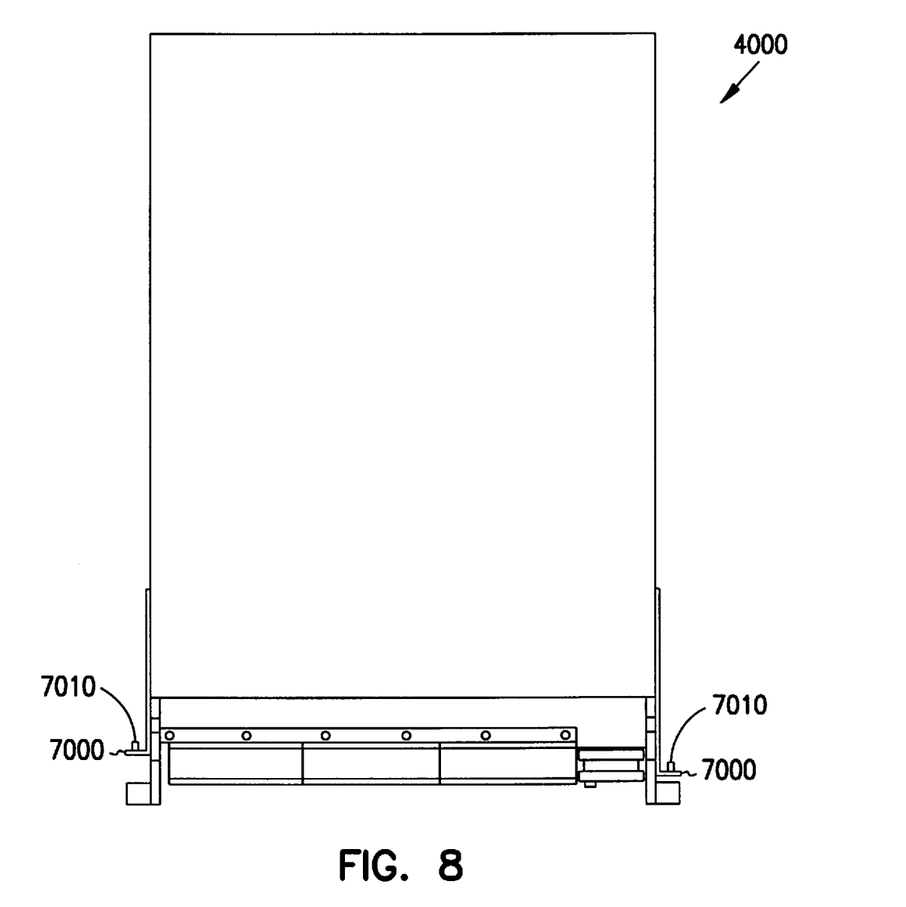
FIG. 8 is a view of an electronic device.
Figure 9:
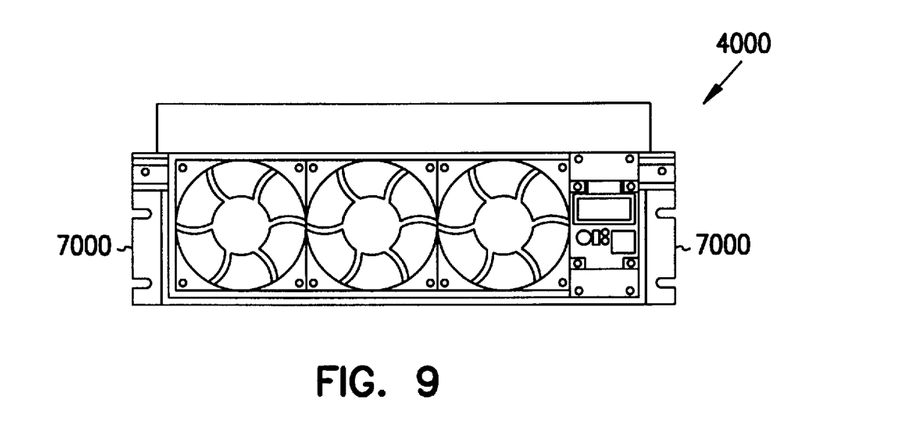
FIG. 9 is a view of an electronic device.
Figure 10:
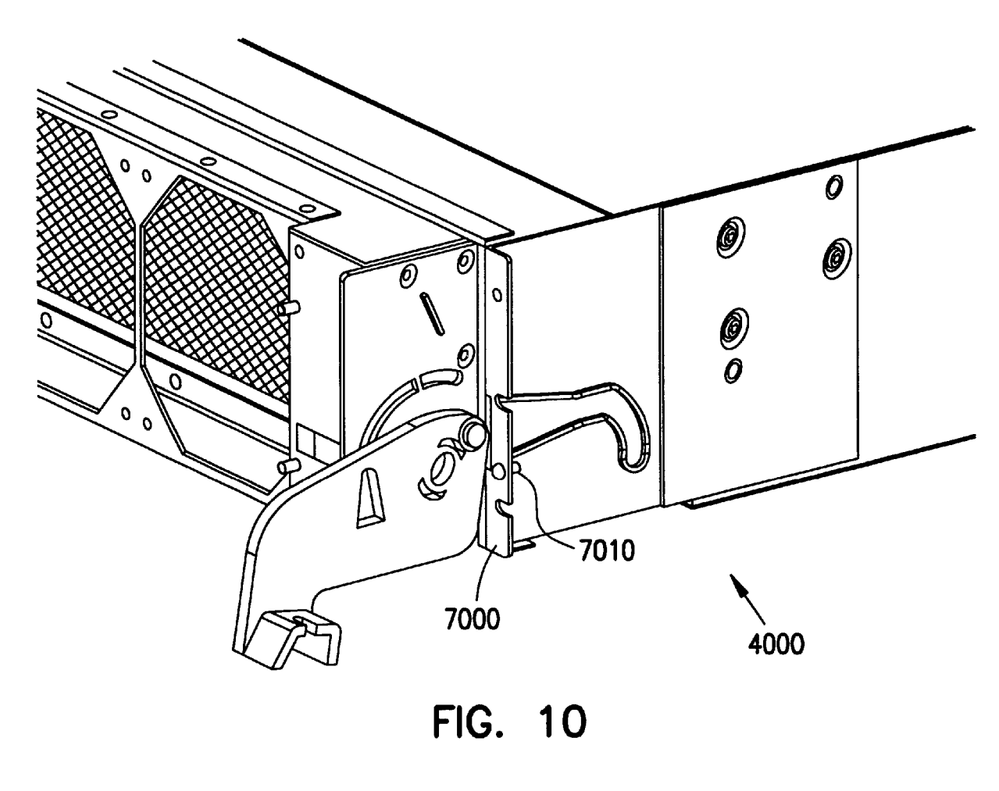
FIG. 10 is a view of an electronic device.

FIGS. 8, 9 and 10 illustrate embodiments in which the front portion of the electronic device or module 4000 includes flanges 7000 extending out each side. Each flange 7000 includes a pin 7010 portion for inserting into an aperture 2020, 2025 in the rail 2000. In one embodiment, the pin 7010 and aperture 2020, 2025 are precisely machined and located to strict tolerances so that placement of the pin 7010 into the aperture helps to control placement of the module 4000 in the structure. In one embodiment, the pin 7010 is precisely machined, apertures 2020, 2025 are precisely machined and at least one hole 2145 within the series of holes 2140 is precisely machined so that the pin 7010 is received in aperture 2020, 2025 and hole 2145. This helps to improve alignment required by additional features such as an insertion/extraction mechanism for inserting and extracting a portion of a module 4000 such as described in U.S. application Ser. No. 09/408,969 Printed Circuit Board Carrier Insertion/Extraction Assembly. In one embodiment, this enables precise and repeatable alignment with other features of the structure such as an external platform as described in U.S. application Ser. No. 09/408148 Computer Module Mounting System and Method for all adjustable positions of the electronic device within the structure and for all adjustable positions of the platform.

In one embodiment, the support bracket is formed from one piece of material. In another embodiment, the interface between the side portion 2160 and the support portion 2130 includes embossments 2170 for strengthening the carrying capacity of the internal support 2000. This allows the internal support 2000 to be formed from a thinner material or a lower strength material than could be used otherwise.

In another embodiment, the internal support 2000 includes side mounting features 3000 that can be used in conjunction with the features 2140 on the front 2110 and rear mounting 2120 portions or can be used independently. In one embodiment, the side mounting features 3000 include tabs 3010, 3020 for engaging slotted apertures 2042 within the series of side apertures 2040 in a custom rail 2000. The side mounting features 3000 include a first set of mounting tabs 3010 extending from the top edge 2180 of the support bracket 2100 and a second set of mounting tabs 3020 extending outward from the support portion 2130. In one embodiment, the custom rail 2000 includes a series of side apertures 2040 which when installed on a structure, run the length of the structure 1000. In one embodiment, the custom rail 2000 includes both a first rail portion 2010 having a first series of apertures 2020 as those described above, and a side rail portion 2050 including the series of side apertures 2040. The series of side apertures 2040 are oriented such that when the mounting tabs 3010, 3020 engage the side apertures 2040 anywhere along the length of the structure 1000, the support bracket 2100 is positioned so that the holes 2150, 2145 on the front mounting portion 2110 and rear mounting portion 2120 align with the first series of apertures 2020 on the structure 1000 or on the rail 2000 installed on the structure 1000. This also improves the ease of fastening the front mounting portion 2110 and rear mounting portion 2120 to the rail 2000.

In another embodiment, the support includes airflow perforations 2190.

In another embodiment, the series of side apertures 2040 are oriented such that when the mounting tabs 3010, 3020 engage the slotted apertures 2042 within the series of side apertures 2040 anywhere along the length of the structure 1000, the support bracket 2100 is positioned so that the side holes 2191 on the side portion 2160 align with a side hole 2044 in the series of side apertures 2040 on the structure 1000 or on the rail 2000. The side holes 2191 are for use in securing the position of the support bracket 2100. In one embodiment, a pushpin is inserted through the side hole 2191 on the support bracket 2100 and through the side hole 2044 within the series of side apertures 2040 within the series of side apertures 2040 in the structure 1000 or rail 2000.

Precise placement of a electronic devices, such as modules 4000, within the structure 1000 with the precision methods described allows for optimization of module 4000 dimensions. Modules 4000 can be designed to have maximum height, width, and depth in order to satisfy industry standards while providing the maximum amount of space internally to the module 4000 and also maximizing module 4000 content within structures 1000. Features providing for automatic alignment and placement of components improves installation, serviceability, upgrade and scalability in an environment traditionally unfavorable to these needs. This provides for improved ability to provide larger computer systems and allows computer systems using these modules 4000 to be scaled, installed, serviced and upgraded at greatly improved levels of performance.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A support bracket for supporting an electronic device within a structure, the bracket comprising:
    a side portion;
    a front surface extending from the side portion and including a portion having at least one hole with threads for use in mounting the support bracket to a portion of the structure;
    a rear surface extending from the side portion and including a portion having at least one hole with threads for use in mounting the support bracket to a portion of the structure;
    a support portion between the front surface and rear surface for supporting an electronic device; and
    a guide portion extending from the side portion for aligning an electronic device relative to the structure;
    wherein the support portion laterally extends a first distance from the side portion and the guide portion laterally extends a second distance from the side portion, the second distance being shorter than the first distance.

2. A support bracket for supporting an electronic device within a structure, the bracket comprising:
    a side portion;
    a front surface extending from the side portion and including a portion having at least one hole with threads for use in mounting the support bracket to a portion of the structure;
    a rear surface extending from the side portion and including a portion having at least one hole with threads for use in mounting the support bracket to a portion of the structure;
    a support portion between the front surface and rear surface for supporting an electronic device; and
    a guide portion extending from the side portion for aligning an electronic device relative to the structure;
    wherein the support portion laterally extends a first distance from the side portion and the guide portion laterally extends a second distance from the side portion, the second distance being shorter than the first distance, wherein the side portion includes a mechanism for coupling the side portion to the structure.

3. The support bracket of claim 2, wherein the side portion includes a guide portion for use in aligning the electronic device.

4. The support bracket of claim 2, wherein the mechanism for coupling the side portion to the structure includes tabs for engaging a portion of a series of side apertures in the structure.

5. The support bracket of claim 2, the side portion including at least one aperture for use with a pushpin for engaging at least a portion of a series of side apertures in the structure, the pushpin being removable.

6. The support bracket of claim 2, wherein engagement of the side mechanism on the side portion with the side portion of the structure, aligns the hole on the front surface and the hole on the rear surface with a respective hole on the structure.

7. The support bracket of claim 2, further comprising at least one embossment at an interface between the support portion and the side portion.

8. The support bracket of claim 2, wherein the side portion includes at least one portion having perforations.

9. A support bracket for supporting an electronic device within a structure, the bracket comprising:
    a side portion;
    a front surface extending from the side portion and including a portion having at least one hole with threads for use in mounting the support bracket to a portion of the structure;
    a rear surface extending from the side portion and including a portion having at least one hole with threads for use in mounting the support bracket to a portion of the structure;
    a support portion between the front surface and rear surface for supporting an electronic device; and
    a guide portion extending from the side portion for aligning an electronic device relative to the structure;
    wherein the support portion laterally extends a first distance from the side portion and the guide portion laterally extends a second distance from the side portion, the second distance being shorter than the first distance, wherein the bracket is vertically adjustable in the structure.

10. The bracket of claim 9, wherein the bracket is formed from a single piece of material.

11. The support bracket of claim 9, wherein the front surface and the rear surface each having at least one alignment hole for aligning the support with a hole on the structure.

12. The support bracket of claim 9, wherein the front portion and the rear portion each having at least one alignment hole for receiving a pin extending from a portion of an electronic device, the electronic device being aligned relative to the structure when the pin is received in the alignment hole.

13. The support bracket of claim 12, wherein the support bracket is reversible and can be used on either side of the structure.

14. A support bracket for supporting an electronic device within a structure, the bracket comprising:
    a side portion;
    a front surface laterally extending from the side portion, the front surface including a portion having:
        at least one hole with threads for use in mounting the support bracket to a rail portion of a structure; and
        at least one alignment hole for receiving a pin extending from a portion of an electronic device for positioning the electronic device relative to the structure;
    a rear surface laterally extending from the side portion, the rear surface including a portion having:

at least one hole with threads for use in mounting the support bracket to a rail portion of a structure; and at least one alignment hole for receiving a pin extending from a portion of an electronic device for positioning the electronic device relative to the structure; and a support portion between the front surface and rear surface for supporting an electronic device.

15. A support bracket for supporting an electronic device within a structure comprising:

a support portion for supporting an electronic device; and a side portion having a mechanism for coupling the side portion to the structure and a guide portion for use in aligning the electronic device relative to the structure, wherein the support portion laterally extends a first distance from the side portion and the guide portion laterally extends a second distance from the side portion, the second distance being shorter than the first distance, wherein the support portion and the guide portion each extend in the same direction away from the side portion such that when the electronic device is supported on the support portion the electronic device contacts the guide portion.

16. The support bracket of claim 15, further comprising:

a front surface including a portion having at least one hole with threads for use in mounting the support bracket to a portion of the structure; and a rear surface including a portion having at least one hole with threads for use in mounting the support bracket to a portion of the structure.

17. A support bracket for supporting an electronic device within a structure comprising:

a support portion for supporting an electronic device; and a side portion having a mechanism for coupling the side portion to the structure and a guide portion for use in aligning the electronic device relative to the structure, wherein the support portion laterally extends a first distance from the side portion and the guide portion laterally extends a second distance from the side portion, the second distance being shorter than the first distance, wherein an interface between the side portion and the support portion includes at least one embossment.

18. A support bracket for supporting an electronic device within a structure comprising:

a support portion for supporting an electronic device; and a side portion having a mechanism for coupling the side portion to the structure and a guide portion for use in aligning the electronic device relative to the structure, wherein the support portion laterally extends a first distance from the side portion and the guide portion laterally extends a second distance from the side portion, the second distance being shorter than the first distance, wherein the mechanism for coupling the side portion to the structure is a set of mounting tabs including at least one tab extending from the top edge of the side portion and at least one tab extending from the support portion.

19. The support bracket of claim 18, wherein the side portion includes at least one portion having perforations.

20. The bracket of claim 18, wherein the bracket is formed from a single piece of material.

21. The support bracket of claim 18 wherein the bracket is reversible and can be used on either side of the structure.

22. The support bracket of claim 18, further comprising a front surface and a rear surface having a portion having at least one alignment hole for aligning the support bracket with a portion of the structure.

23. The support bracket of claim 22, wherein the front surface and the rear surface each having said at least one alignment hole for receiving a pin extending from a portion of an electronic device, the electronic device being aligned relative to the structure when the pin is received in the alignment hole.

24. A support bracket for supporting an electronic device within a structure comprising:

a support portion for supporting an electronic device; and a side portion having a mechanism for coupling the side portion to the structure and a guide portion for use in aligning the electronic device relative to the structure, wherein the support portion laterally extends a first distance from the side portion and the guide portion laterally extends a second distance from the side portion, the second distance being shorter than the first distance, the side portion including at least one aperture for use with a pushpin for engaging at least a portion of a series of side apertures in the structure, the pushpin being removable.

25. A method of accommodating a larger module in an industry size structure for supporting electronic components, comprising:

providing a structure having a standard industry size, the structure having a rail portion;

providing at least one support bracket having:
a front surface having a portion with:
at least one hole with threads for use in mounting the support bracket to the rail portion of the structure; and
at least one alignment hole for receiving a pin extending from a portion of an electronic device;
a rear surface having a portion with:
at least one hole with threads for use in mounting the support bracket to the rail portion of the structure; and
at least one alignment hole for receiving a pin extending from a portion of an electronic device;
a support portion between the front surface and rear surface for supporting an electronic device; and
a side portion having a guide portion for aligning an electronic device relative to the structure;

providing a plurality of fasteners;

inserting a fastener through an aperture in the rail portion of the structure and engaging the fastener with the at least one hole with threads on the front surface of the support bracket;

inserting a fastener through an aperture in the rail portion of the structure and engaging the fastener with the at least one hole with threads on the rear surface of the support bracket;

providing an electronic device having a portion with a pin;

installing the electronic device onto the support bracket by sliding the device along the support portion of the support bracket, until the pin is received in the alignment hole on the support bracket, the position of the device being maintained by the guide portion of the support bracket.

* * * * *

UNITED STATES PATENT AND TRADEMARK OFFICE
CERTIFICATE OF CORRECTION

PATENT NO. : 6,513,770 B1
DATED : February 4, 2003
INVENTOR(S) : Perry D. Franz and Jeffrey M. Glanzman It is certified that error appears in the above-identified patent and that said Letters Patent is hereby corrected as shown below:

<u>Column 5,</u>
Lines 65-67, delete "side portion includes a guide portion for use in aligning the electronic device" and insert -- guide portion includes a first surface extending from the side portion and a second surface extending approximately perpendicularly from an end of the first surface -- therefor.

Signed and Sealed this

Twenty-sixth Day of August, 2003

JAMES E. ROGAN
*Director of the United States Patent and Trademark Office*